United States Patent [19]
Cherne

[11] Patent Number: 5,315,144
[45] Date of Patent: May 24, 1994

[54] REDUCTION OF BIPOLAR GAIN AND IMPROVEMENT IN SNAP-BACK SUSTAINING VOLTAGE IN SOI FIELD EFFECT TRANSISTOR

[75] Inventor: Richard D. Cherne, West Melbourne, Fla.

[73] Assignee: Harris Corporation, Melbourne, Fla.

[21] Appl. No.: 947,177

[22] Filed: Sep. 18, 1992

[51] Int. Cl.$^5$ .................... H01L 27/01; H01L 29/76; H01L 27/12; H01L 29/94

[52] U.S. Cl. .................... 257/351; 257/344; 257/347; 257/350; 257/408

[58] Field of Search ............... 257/347, 348, 349, 350, 257/351, 352, 353, 354, 408, 409, 344, 336

[56] References Cited

U.S. PATENT DOCUMENTS 4,786,955  11/1988  Plus et al. .................... 257/351

FOREIGN PATENT DOCUMENTS 3-120836  5/1991  Japan .................... 257/344

Primary Examiner—Rolf Hille
Assistant Examiner—Steven Loke
Attorney, Agent, or Firm—Charles E. Wands

[57] ABSTRACT

The gain of a parasitic lateral bipolar device in an MOS SOI structure is reduced to increase the differential between the snap-back sustaining voltage and the maximum recommended power supply voltage. Prior to insulated gate structure definition, very lightly doped source and drain regions are implanted to the underlying insulator layer. The source and drain regions have a doping concentration that is within an order of magnitude of the doping concentration of the well portion of the semiconductor layer. After the very lightly doped regions have been implanted, the implant mask is stripped and an insulated gate structure is formed atop the channel surface portion of the well layer between the source and drain regions. Using the insulated gate structure as a mask, off-axis, high angle implants of the same conductivity type as the source and drain regions are carried out to a first depth that only partially penetrates the depth of the deep source and drain implants. Very shallow high impurity concentration ohmic contact regions are then formed in surface portions of the first and second regions, and ohmic contact layers are formed on the conductive gate layer and the high impurity concentration ohmic contact regions.

12 Claims, 16 Drawing Sheets

REDUCTION OF BIPOLAR GAIN AND IMPROVEMENT IN SNAP-BACK SUSTAINING VOLTAGE IN SOI FIELD EFFECT TRANSISTOR

FIELD OF THE INVENTION

The present invention relates in general to the manufacture of integrated circuits and is particularly directed to a technique for reducing the gain of a parasitic bipolar transistor formed in the source-channel-drain path, so as to improve the snap-back sustaining voltage in a semiconductor-on-insulator field effect transistor architecture.

BACKGROUND OF THE INVENTION

FIGS. 1–17 diagrammatically illustrate the cross-section of a MOSFET architecture at respective steps in the course of its manufacture using a conventional off-axis, high angle (e.g. 30° to 60°)/rotated wafer, lightly doped drain (LDD) ion implantation process to enhance parametric characteristics of the device, in particular, for suppressing the kink effect and snap-back in N-channel SOI transistors and related lateral bipolar effects in P-channel SOI transistors.

More particularly, FIG. 1 shows an N type semiconductor (silicon) substrate 11 having a buried oxide layer 13 and a silicon epitaxial layer 15 formed to a prescribed thickness on the top surface of the substrate 11. Following initial oxidation of the top surface 21 of the epitaxial silicon layer 15 to form a surface pad oxide layer 23, a layer of polysilicon 25, which is to serve as an etch-stop, is deposited on pad oxide layer 23 and the structure is selectively etched down to buried oxide layer 13, so as to form a trench 28 which effectively patterns the silicon into a mesa architecture, shown in FIG. 2 as comprising respective mesas 31 and 32 into which complementary field effect transistor devices are to be introduced.

FIG. 3 shows the formation of a trench oxide layer 41 which fills the trench pattern 28 that surrounds mesas 31, 32 and also overlies the mesas themselves, together with a planarization photoresist structure 36 including photoresist plugs 43 and a topside layer of photoresist 45. The structure of FIG. 3 is planarized, for example by means of a reactive ion etch, which terminates at the top surface 27 of the polysilicon etch stop layer 25, so as to realize the planar configuration shown in FIG. 4, in which oxide layer 41 fills the mesa-surrounding trench pattern 28 up to a level that is coplanar with the top surface 27 of polysilicon layer 25. Following geometry definition of the trench oxide, the etch-stop polysilicon layer 25 is removed, as shown in FIG. 5.

Complementary retrograde wells are next introduced through surface pad oxide layer 23 into mesas 31 and 32, by selectively masking mesas 31 and 32 and performing deep and shallow conductivity type-determining implants in each of the mesas to form an N-well 51 in mesa 31 and a P-well 52 in mesa 32, as illustrated in FIGS. 6 and 7, respectively. After photoresist masking material has been removed, then, to the extent necessary, a shallow P-threshold adjustment implant is performed, as shown at 55 in FIG. 8, and the structure is annealed, to set the conductivity characteristics of the N and P wells 51 and 52.

The structure of FIG. 8 is then subjected to an oxide etch which removes pad oxide layer 23 and a portion of the trench oxide 41, as shown in FIG. 9. A gate oxide layer 56 is formed atop the N and P wells 51, 52 to realized gate oxide layers 61, 62 as shown in FIG. 10, followed by the formation and (N+) doping of a polysilicon layer, which is then selectively etched into doped polysilicon gate layers 63, 65 overlying N and P wells 51, 52, respectively, as shown in FIG. 10.

The structure of FIG. 10 is next selectively masked and subjected to off-axis, high angle (e.g. 30° to 60°)/rotated wafer, lightly doped source and drain (LDD) ion implantations, shown at 71, 72 in FIGS. 11 and 12, respectively, so as to form shallow P type source and drain regions 81, 82 in N well 51, and shallow N type source and drain regions 91, 92 in P well 52. As pointed out earlier, this high angle implant serves to suppress the kink effect and snap-back in the N-channel SOI transistor formed in P well 52.

After removal of surface masking material, a layer of spacer oxide material 101 is non-selectively deposited on the complementary well structure, as shown in FIG. 13 and the surface oxide is then etched down to the top surface 21 of the epitaxial silicon layer 15, leaving spacers 111, 112 contiguous with the sidewalls of polysilicon gate 63 overlying gate oxide layer 61 and spacers 121, 122 contiguous with the sidewalls of polysilicon gate 65 overlying gate oxide layer 62, as shown in FIG. 14.

The structure shown in FIG. 14 is subjected to a nonselective surface reoxidation, which forms source and drain oxide layers 131, 132 on the complementary wells (and also atop polysilicon gates 63, 65), as shown in FIG. 15. The respective P channel and N channel devices are next implanted with deep, high impurity concentration source and drain regions, which must fully bottom out on buried oxide layer 13, in order to prevent backwall (device-to-device) parasitic shorts and minimize junction leakage. The respective implants are low angle (vertical) implants, self-aligned with spacers 111, 112, and 121, 122 of gate structures 63, 65 as shown in FIGS. 16 and 17, respectively, forming deep P+ source and drain regions 141, 142 in the P-channel device formed in N-well 51, and deep N+ source and drain regions 151, 152 in the N-channel device formed in P-well 52.

The substantially increased (overcompensating) doping levels of deeply implanted regions 141, 142 and 151, 152 is due to the fact that the these regions are typically implanted at energy levels that will not penetrate the insulated gate structures 63, 65, which are employed as self-alignment masks, as described above, and to ensure that the (retrograde) doping of the wells 51, 52 will be effectively overcompensated, as necessary. (Hence, high doping levels are needed to ensure that the dopant reaches the backwall interface of buried oxide layer 13). After the oxide overlying the gate structures is removed, a silicide layer is formed atop the gate polysilicon, and the source and drain regions.

As a consequence of the high doping concentration of the deep implants, and especially in the case of the N-channel transistor formed in P-well 52, which is individually illustrated in FIG. 18 absent the silicide layer, the gain of a lateral parasitic NPN bipolar device (established in the source-channel-drain path, as shown schematically at 160) can seriously degrade the breakdown characteristics of the transistor. To prevent snap-back, the sustaining voltage $V_{SUS}$ should be kept well above the maximum recommended power supply voltage of the circuit.

Since an increase in the gain of the parasitic NPN bipolar device 160 reduces the sustaining voltage of the MOS device, it is desirable to degrade the injection efficiency of its emitter region (the source region of the N-channel MOS device). However, the high doping level required to realize oxide-bottomed out source and drain implants 151, 152, goes directly against this objective, so that the physical structure of the conventional SOI MOS device incurs an inherent performance penalty.

SUMMARY OF THE INVENTION

In accordance with the present invention, the gain of the parasitic lateral bipolar device is substantially reduced, so as to increase the snap-back sustaining voltage. For this purpose the present invention involves, prior to insulated gate structure definition, implanting very lightly doped source and drain regions into spaced apart portions of an SOI structure, such that the very lightly doped source and drain regions extend from first and second spaced apart surface portions of a semiconductor channel or well layer down to the underlying insulator layer. By very lightly doped is meant that the source and drain regions have a doping concentration that is within an order of magnitude of the doping concentration of the well portion of the semiconductor layer.

In order to reduce the number of masking steps employed to realize a CMOS SOI architecture, very lightly doped N source and drain regions of an N-channel device may be formed simultaneously with the formation of the N well portion of a P-channel device and, conversely, very lightly doped P source and drain regions of a complementary polarity P-channel device may be formed simultaneously with the formation of the P well portion of the N-channel device.

Because the very lightly doped and physically deep source and drain regions are implanted in the absence of gate structure (but with the gate area sufficiently masked against implanting in the channel) the implant energy can be increased above the level that is normally employed to bottom out heavily doped regions, described above, so as to ensure that the reduced doping density will extend completely through the silicon layer to the underlying oxide in spite of the low dopant concentration.

After the very lightly doped regions have been implanted, the very light doping implant mask is stripped and an insulated gate structure (e.g. gate oxide and polysilicon gate conductor) is formed atop the channel surface portion of the well layer between the very lightly doped source and drain regions. Then, using the insulated gate structure as a mask, off-axis, high angle implants of the same conductivity type as the source and drain regions are carried out to a first depth that only partially penetrates the depth of the deep source and drain implants. These shallow first and second source and drain sub-regions have a doping concentration approximating that or on the order of that of the very lightly doped, deep source and drain implants and, because of the high incidence angle extend partially beneath the insulated gate structure by a prescribed distance which establishes the channel length of the MOS SOI field effect transistor. Next, gate sidewall spacers are formed, and very shallow high impurity concentration ohmic contact regions are introduced into surface portions of the first and second sub-regions. Ohmic contact (e.g. silicide) layers are then formed on the conductive gate layer and the high impurity concentration ohmic contact regions.

As a further enhancement, third and fourth source and drain sub-regions may be implanted, again using the insulated gate structure as a mask, to a second depth that is deeper than the first depth, but still only partially penetrating the depth of the very lightly doped source and drain regions to a depth less than the thickness of the semiconductor layer. These third and fourth sub-regions have a doping concentration approximating that of the very lightly doped source and drain regions. These additional sub-regions serve to effectively 'push-down' the location where a depletion region is formed at the drain/well PN junction, so as to increase the separation between the depletion region and the drain contact region, thereby reducing the possibility of enhanced avalanche generation or junction shorting.

As pointed out above, the very light doping of the physically deep source and drain regions is within an order of magnitude of the doping concentration of the channel/well layer and may be approximately equal to that of the doping concentration of the channel/well layer, which has been found to significantly degrade the injection efficiency of the emitter (source) of the parasitic lateral bipolar device, and thereby reduce bipolar gain and increase the sustaining voltage threshold.

DETAILED DESCRIPTION

Figure 19:
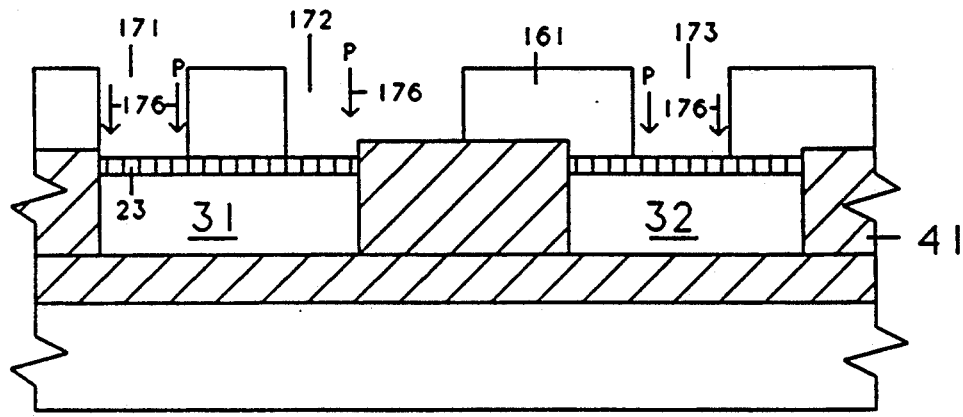
FIGS. 19-31 show successive steps in a process for manufacturing an MOS SOI in accordance with the present invention.
Figure 20:
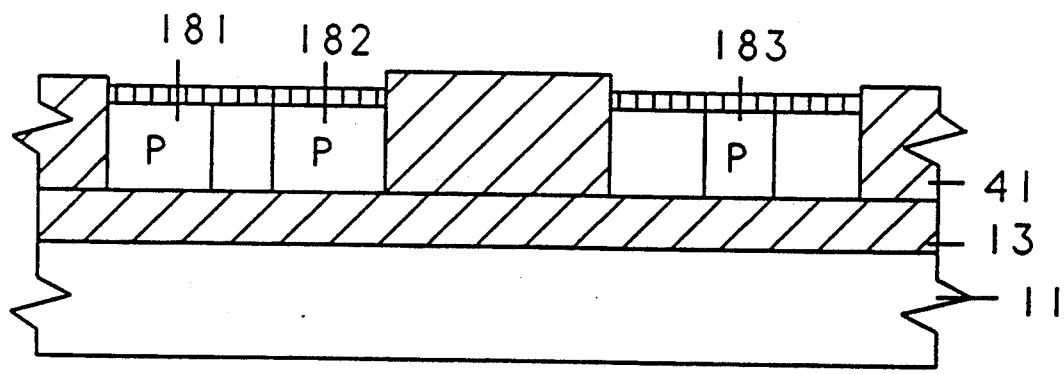

FIGS. 19-31 show successive steps in a process according to the present invention for manufacturing an MOS SOI device for the purpose of substantially reducing the emitter injection efficiency and the gain of a parasitic lateral bipolar device, and thereby enhancing the differential between the snap-back sustaining voltage and the maximum recommended power supply voltage. Specifically, FIG. 19 shows an SOI structure at that point in the manufacturing process corresponding to that shown in FIG. 5 in which the etch-stop polysilicon layer has been removed, leaving pad oxide layer 23 overlying the surfaces of each of mesas 31 and 32. Namely, the initial steps in the process are those described above with reference to FIGS. 1-5.

Figure 1:
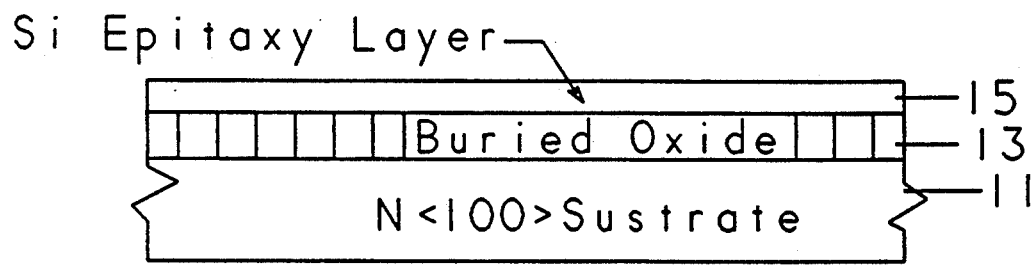
FIG. 1-17 diagrammatically the cross-section of a MOSFET architecture at respective steps in the course of its manufacture using a conventional off-axis, high angle rotated wafer, lightly doped drain (LDD) ion implantation process.
Figure 2:
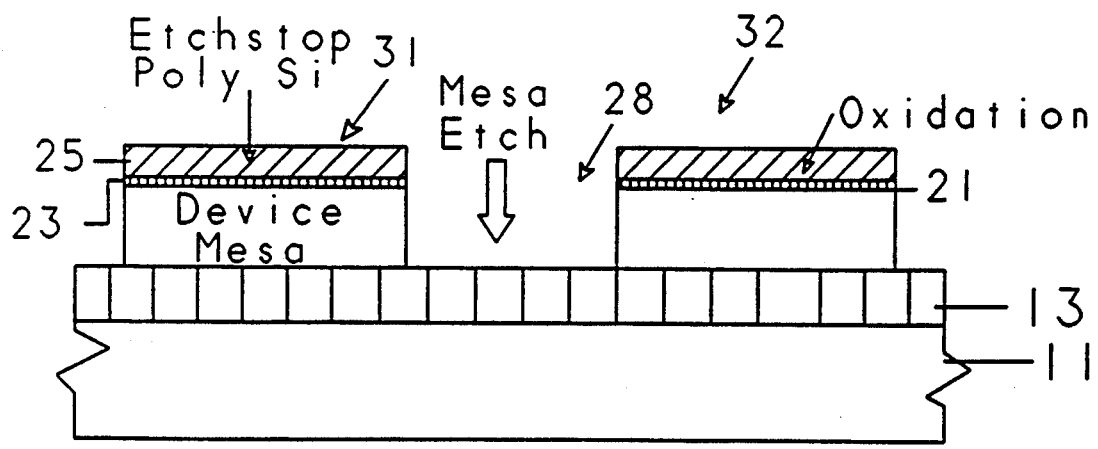
Figure 3:
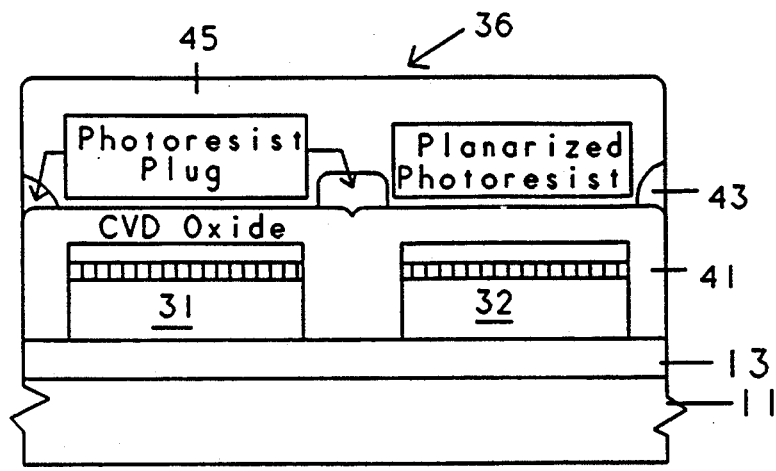
Figure 4:
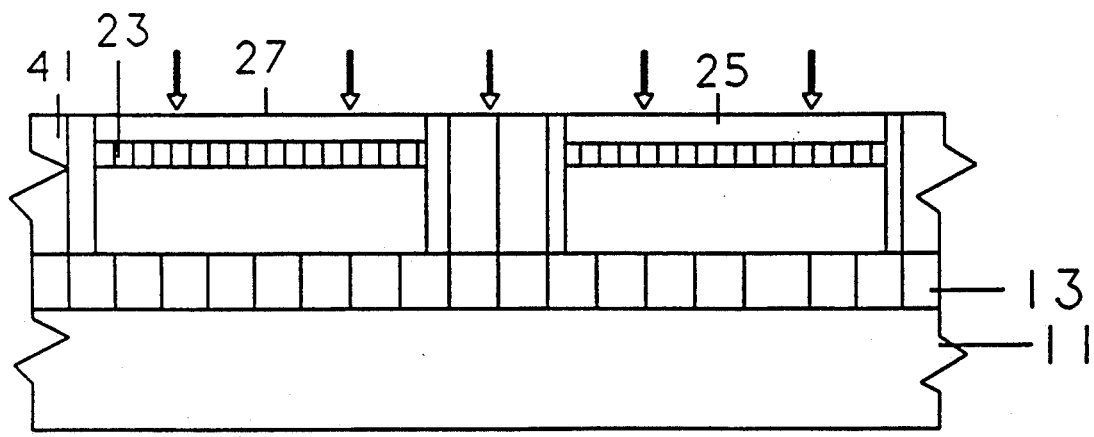
Figure 5:
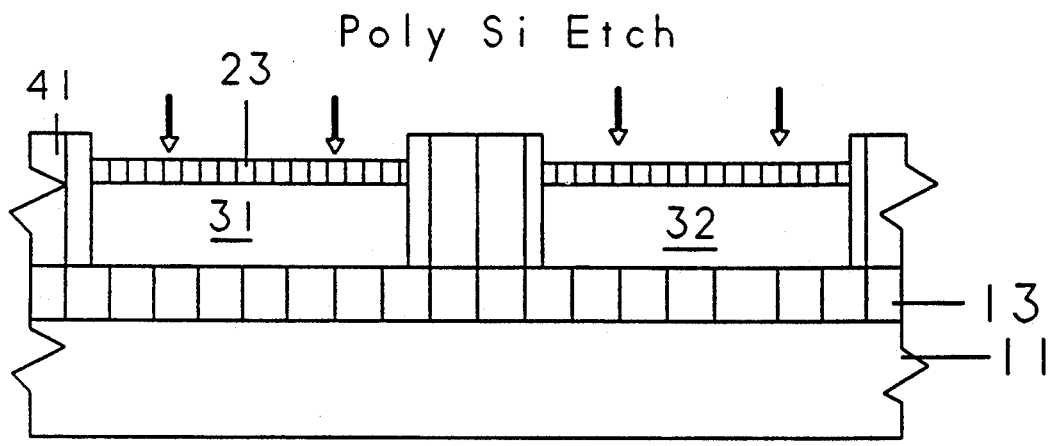
Figure 6:
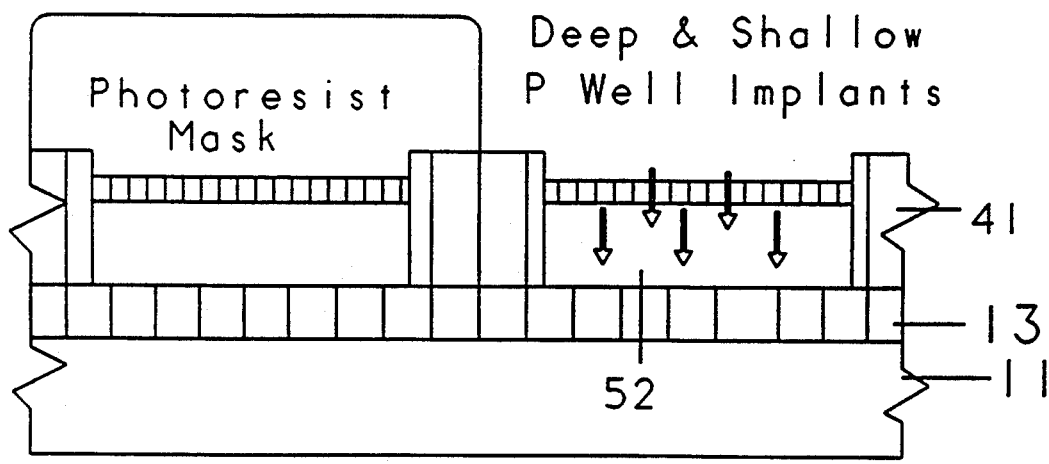
Figure 7:
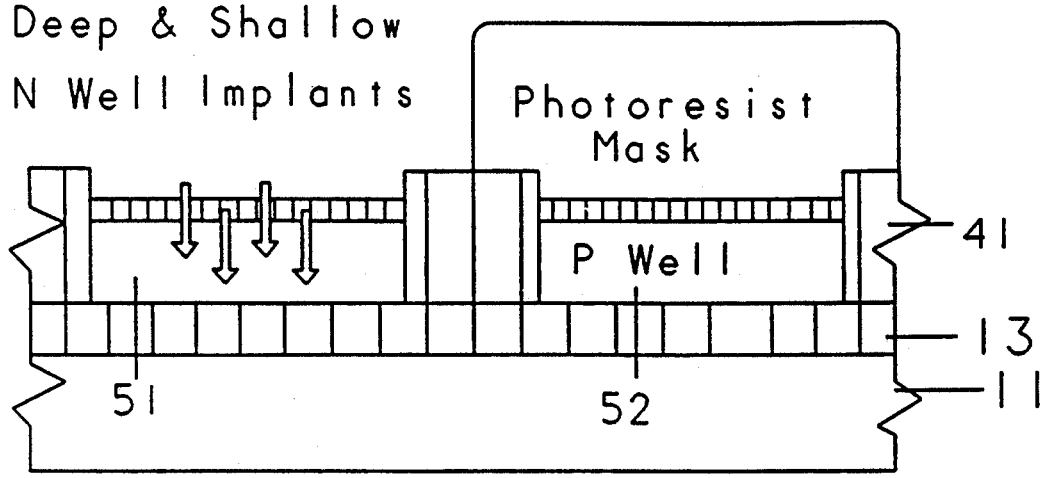
Figure 8:
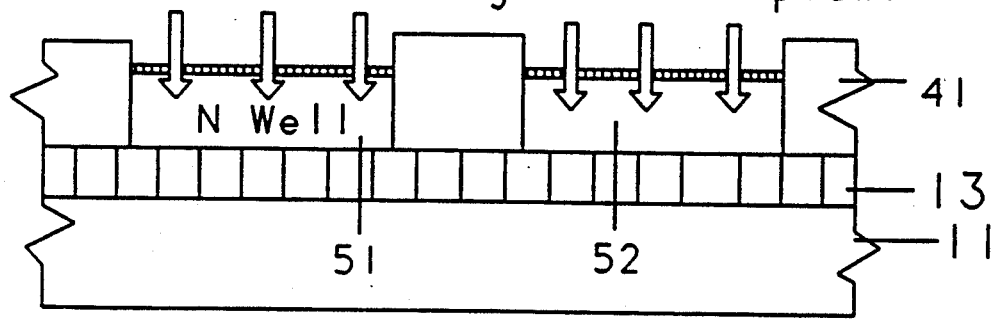
Figure 9:
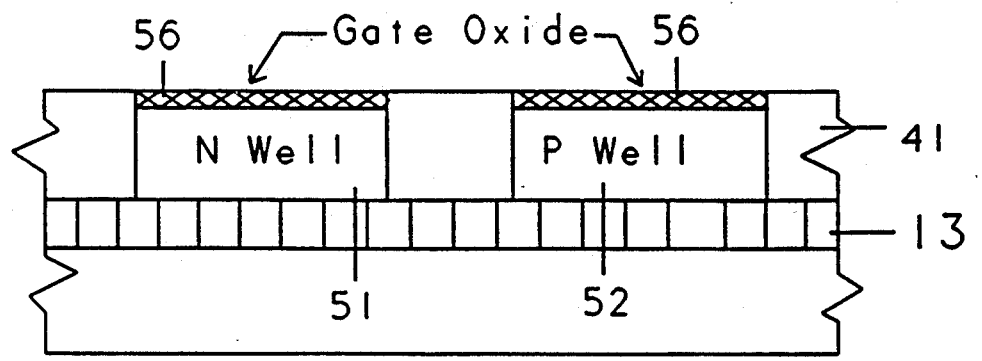
Figure 10:
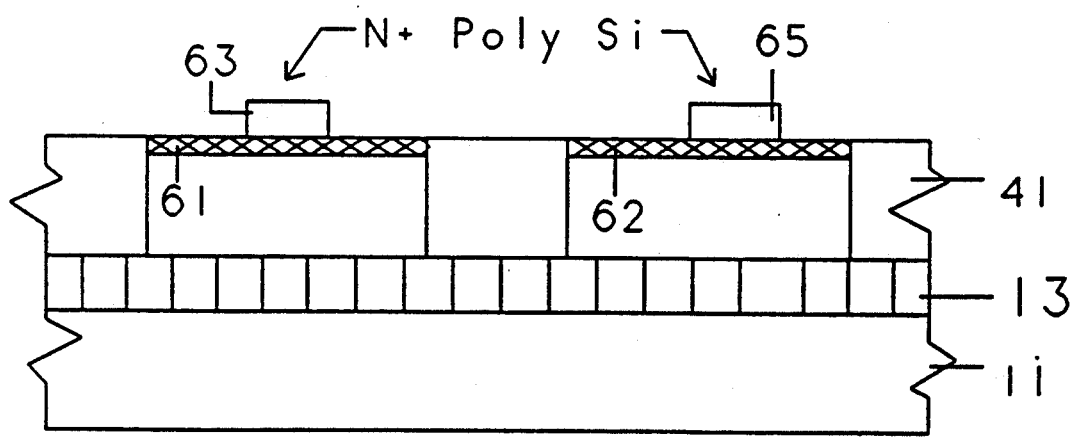
Figure 11:
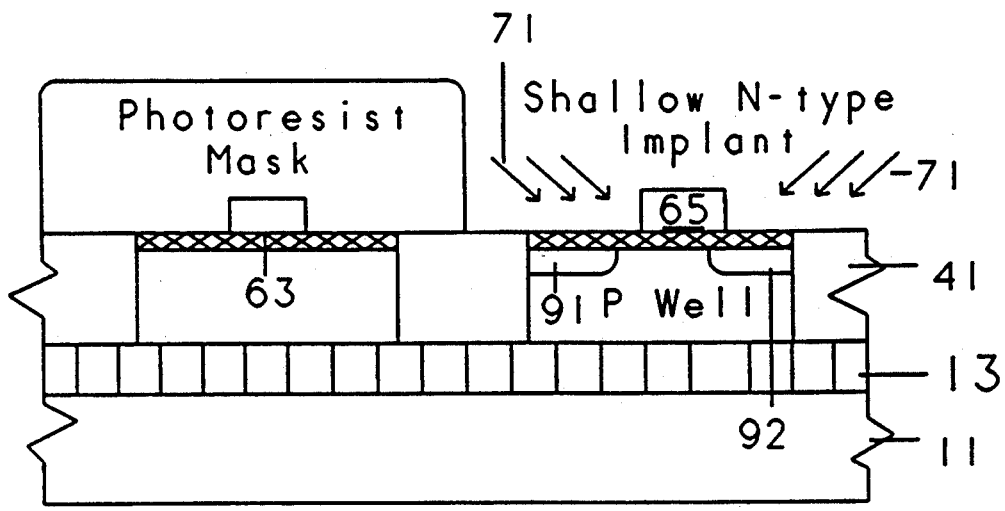
Figure 12:
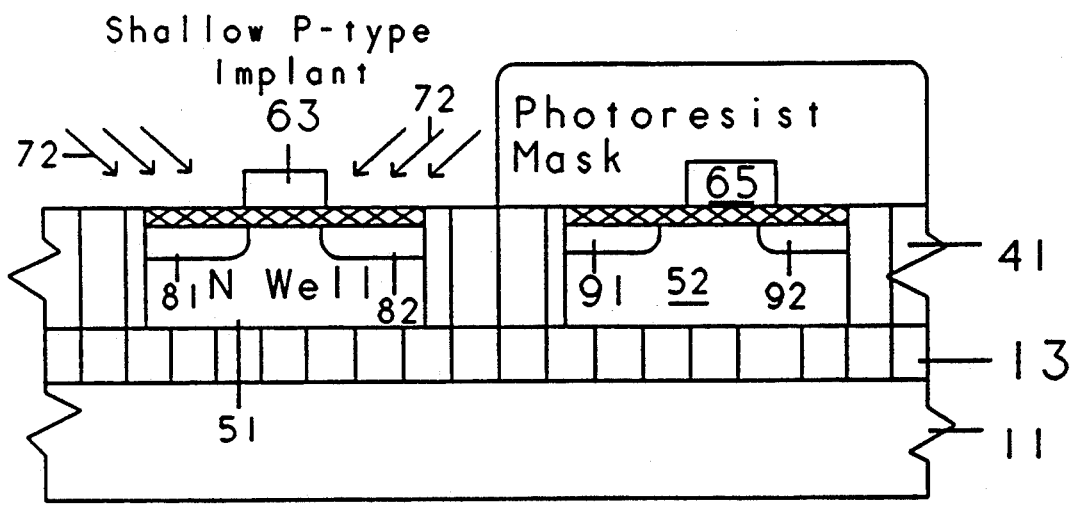
Figure 13:
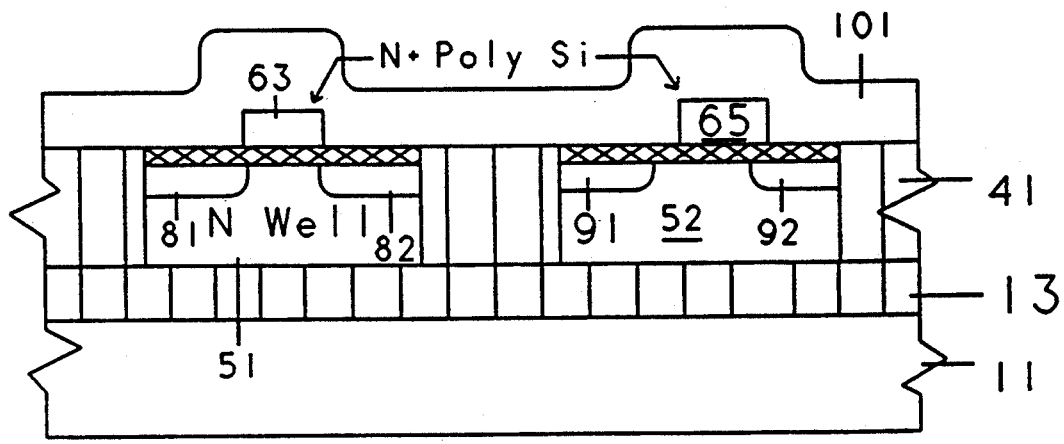
Figure 14:
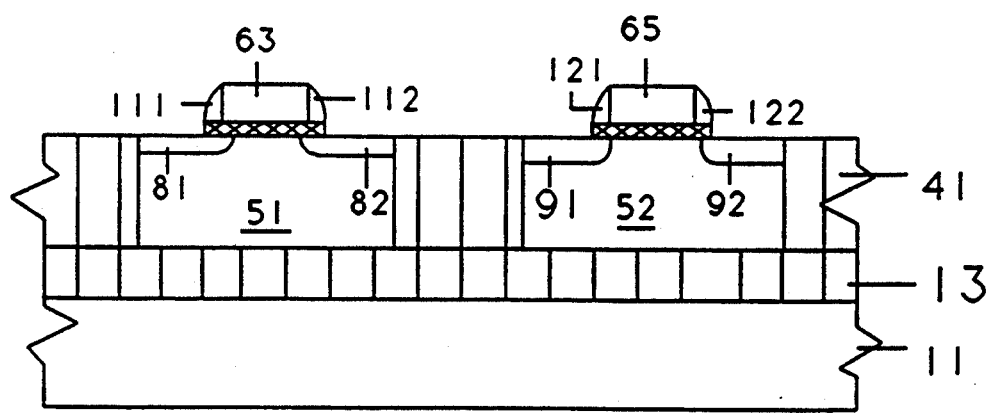
Figure 15:
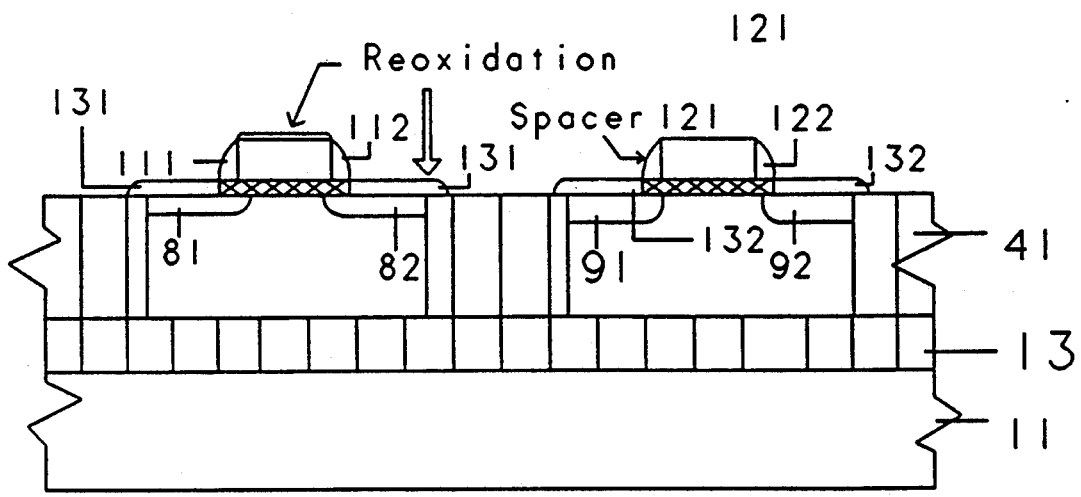
Figure 16:
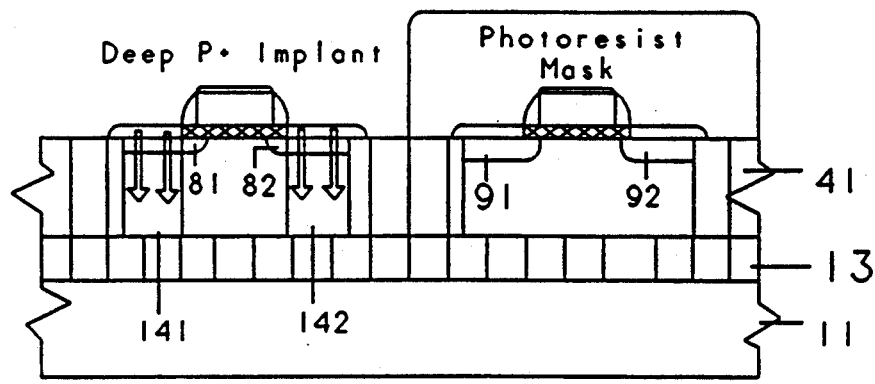
Figure 17:
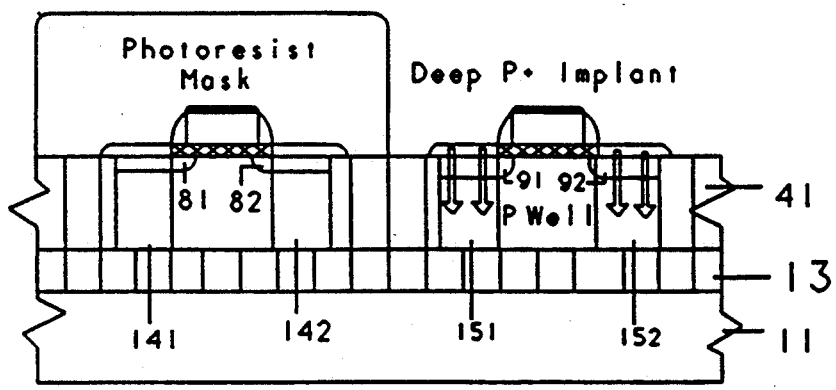
Figure 18:
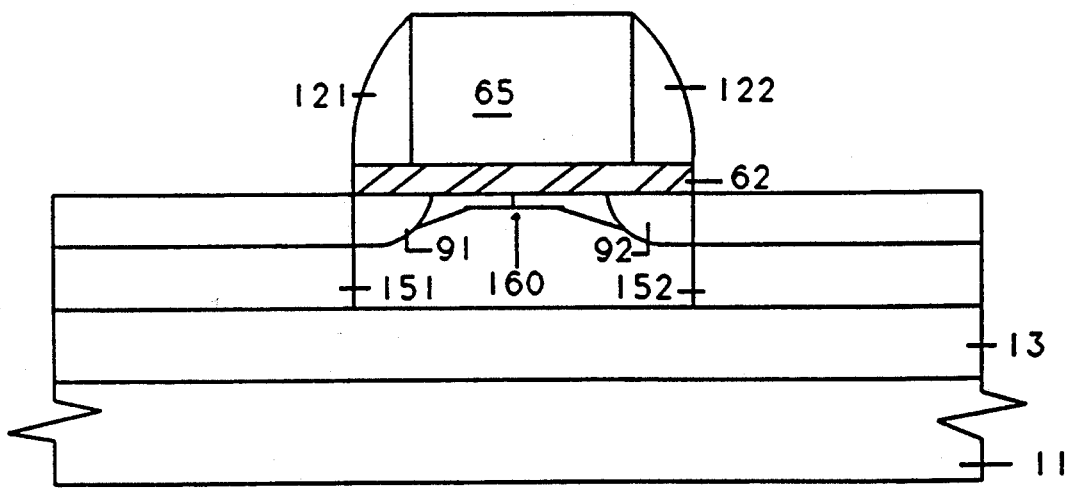
FIG. 18 diagrammatically illustrates the cross-section of a prior art MOS SOI device in which shallow lightly doped source and drain regions are by the using off-axis, high angle ion implantation of FIGS. 1-17.

Pursuant to the present invention, rather than initially dope the entirety of a selected mesa with a retrograde implant profile, an implantation mask, for example a layer of photoresist 161, is selectively formed on the structure of FIG. 5, so as to expose source and drain-associated apertures 171, 172 overlying the surface of N-well 51, on the one hand, and to expose a portion 173 of P-well 52 into which an N-channel region is to be formed. A controlled, high energy, low ion density P-type beam 176 is directed upon the mesa surfaces at a substantially vertical or normal angle, so as to form, in N-well 51, physically deep, but very lightly doped P-type source and drain regions 181, 182 and, in P-well 52 a physically deep and very lightly doped P-type channel region 183. Regions 181, 182 extend completely through the thickness of N-well 51 and region 183 extends completely through the thickness of P-well 52 down to buried oxide layer 13.

As explained previously, by very lightly doped is meant that P-type source and drain implants 181, 182 and P-well (boron) implant 183 have a doping concentration that is within an order of magnitude of the doping concentration of a previously formed or a to be subsequently formed complementary N-type implant and may correspond to the impurity concentration of such an N-type implant in atoms/cm$^3$. For a typical N-channel device formed in P-well 52 operating at 1.2 volts, the P-well implant in region 183 may have a doping concentration of $1-3\times 10^{17}$ cm$^{-3}$, and N-type source and drain regions of that device may have a doping range on the order of $1-10\times 10^{17}$ cm$^{-3}$.

Figure 21:
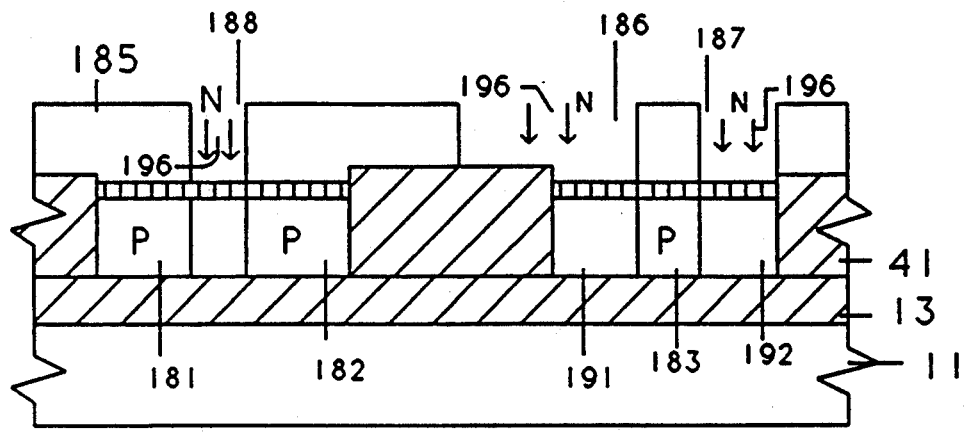

After the implantation of P-type regions 181, 182 and 183, photoresist mask 161 is stripped and a mirror image of that mask is formed on pad oxide layer 23, shown as complementary mask 185 in FIG. 21. Mask 185 exposes source and drain-associated apertures 186, 187 overlying the surface of P-well 52, on the one hand, and to expose a portion 188 of N-well 51 into which a P-channel region is to be formed. As in the previous implant step, a controlled, high energy, low ion density N-type beam 196 is directed upon the mesa surfaces at a substantially vertical or normal angle, so as to form, in mesa 52, physically deep, but very lightly doped N-type source and drain regions 191, 192 and, in N-well 51 a physically deep and very lightly doped N-type channel region 193. Source, drain regions 191, 192 extend completely through the thickness of P-well 52 and channel region 193 extends completely through the thickness of N-well 51 down to buried oxide layer 13. Again, by very lightly doped is meant that N-type source and drain implants 191, 192 and N-channel implant 193 have a doping concentration that is within an order of magnitude of the doping concentration of previously formed complementary P-type implant of FIG. 20.

In the complementary doped structures of FIG. 21, since the very lightly doped source and drain regions 181, 182, 191, 192 are implanted in the absence of gate structure (the channel area of the associated device is masked by the substantial thickness of a sacrificial mask layer 161/185) the implant energy of ion beams 176 and 196 can be increased above the level that is normally employed to bottom out conventionally employed 'heavily' doped regions, so that the reduced or very light doping profile of the P-type source and drain regions 181, 182 in N-well 51 and the N-type source and drain regions 191, 192 in P-well 52 and will extend completely through the mesas to underlying oxide 13. Phosphorus (N-type) dosage implant parameters, for example, may be on the order of $1-2\times 10^{13}$ cm$^{-2}$ at 300 KeV.

Figure 22:
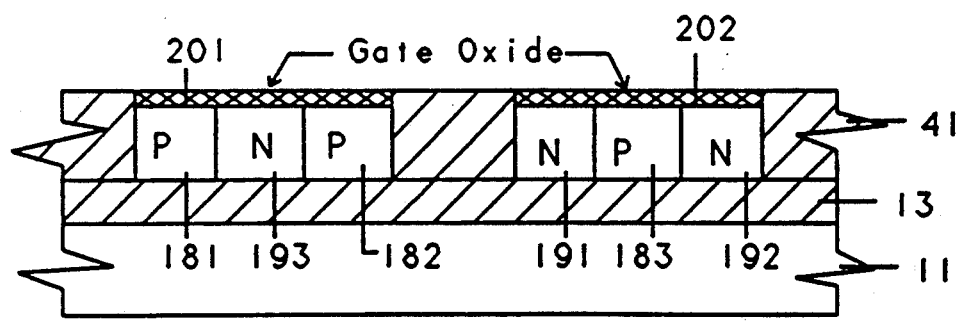

After removal of photomask 185, the complementary structure of FIG. 21 is subjected to an oxide etch which removes pad oxide layer 23 and a surface portion of the trench oxide 41. A gate oxide layer is formed atop the implanted mesas 51, 52 to obtain gate oxide layers 201, 202 as shown in FIG. 22. A polysilicon layer is then formed, (N+) doped and selectively etched into doped polysilicon gate layers 203, 204 overlying N and P-well regions 193 and 183, respectively, as shown in FIG. 23.

Figure 23:
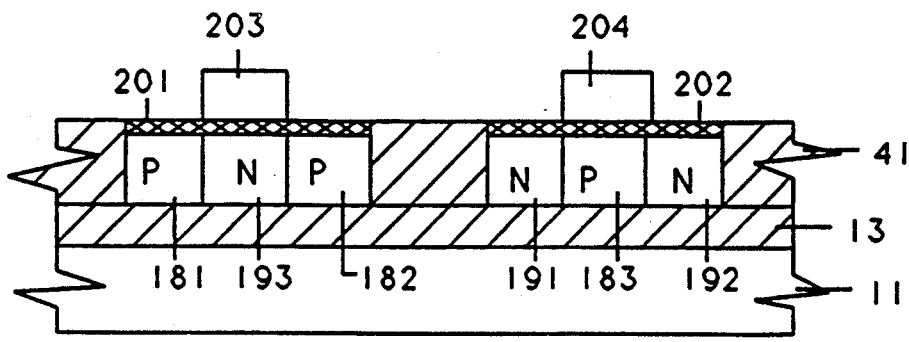
Figure 24:
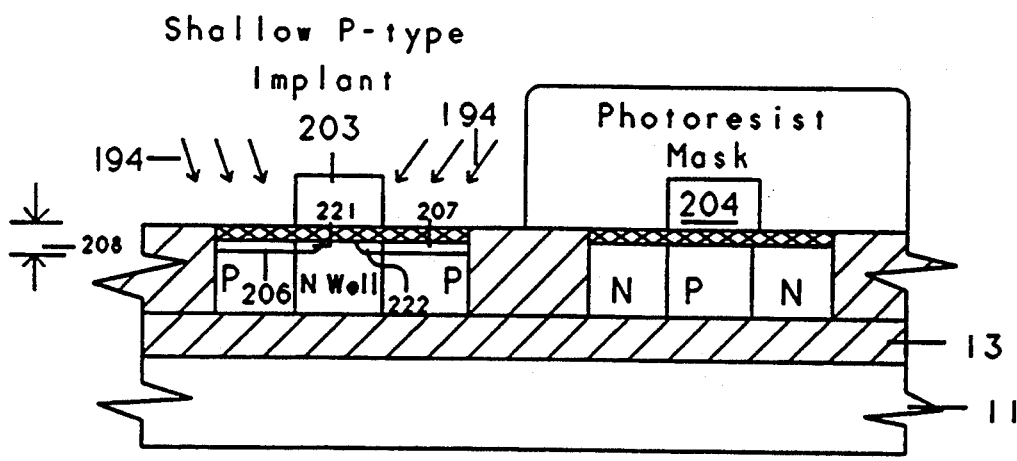
Figure 25:
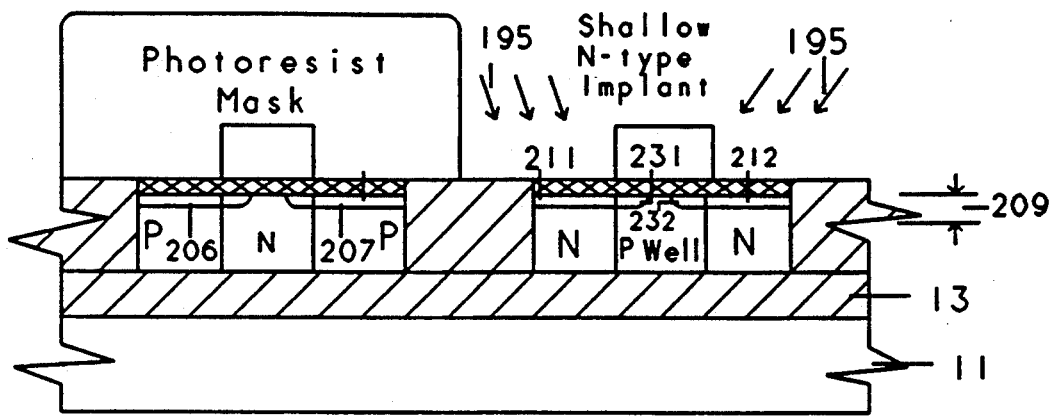

The structure of FIG. 23 is selectively masked as shown in FIG. 24, and exposed to off-axis, high angle (e.g. 30° to 60°)/rotated wafer, lightly doped source and drain (LDD) ion implantations, shown at 194, 195, in FIGS. 24 and 25, respectively, so as to form shallow lightly doped P type source and drain sub-regions 206, 207 in mesa 51, and shallow lightly doped N type source and drain sub-regions 211, 212 in mesa 52. As pointed out earlier, this high angle implant serves to suppress the kink effect and snap-back in the N-channel SOI transistor formed in the N-channel device of mesa 52.

The depths to which the lightly doped source and drain sub-regions are implanted, shown as depths 208, 209 respectively, are such that the sub-regions only partially penetrate the depth (on the order of 0.4 microns) of the deep source and drain implants (i.e. the thickness of layer mesa layers 51, 52). These shallow lightly doped source and drain sub-regions have a doping concentration approximating that or on the order of magnitude as that of the very lightly doped, deep source and drain regions. These lightly doped source and drain sub-regions may have a doping concentration on the order of $10^{18}$ cm$^{-3}$ to a depth of 0.15 to 0.2 microns. Because of the high incidence angle of beams 194, 195, the leading edges 221, 222 of P-type source and drain sub-regions 206, 207 and the leading edges 231, 232 of N-type source and drain sub-regions 211, 212, respectively, extend partially beneath the insulated gate structures 203, 204 by a distance which establishes the channel lengths of the complementary MOS SOI field effect devices.

Figure 26:
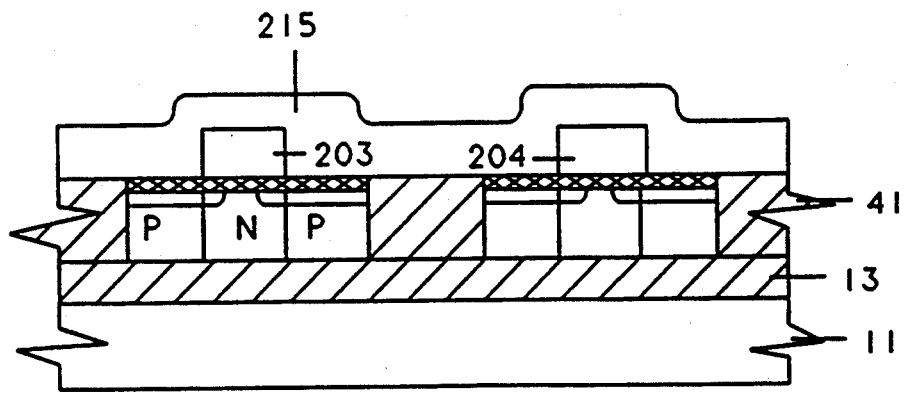

Next, as shown in FIG. 26, a layer of spacer oxide material 215 is then non-selectively deposited on the complementary well structure, including doped gate layers 203, 204. The surface oxide material is then etched down to the top surface 21 of the epitaxial silicon layer 15, leaving spacers 241, 242 contiguous with the sidewalls of polysilicon gate 203 overlying gate oxide layer 201, and spacers 251, 252 contiguous with the sidewalls of polysilicon gate 204 overlying gate oxide layer 202, as shown in FIG. 27.

Figure 27:
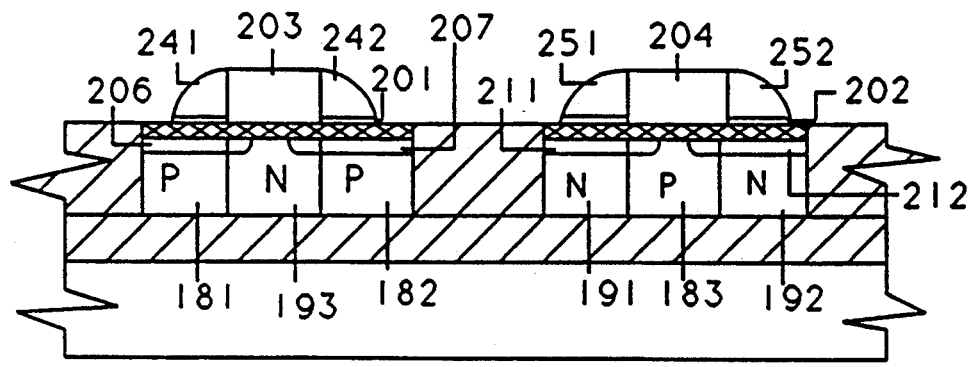
Figure 28:
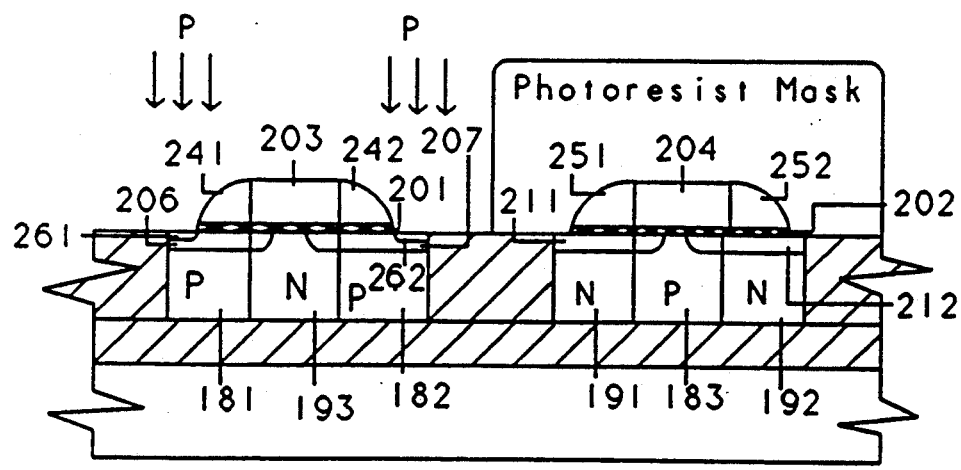
Figure 29:
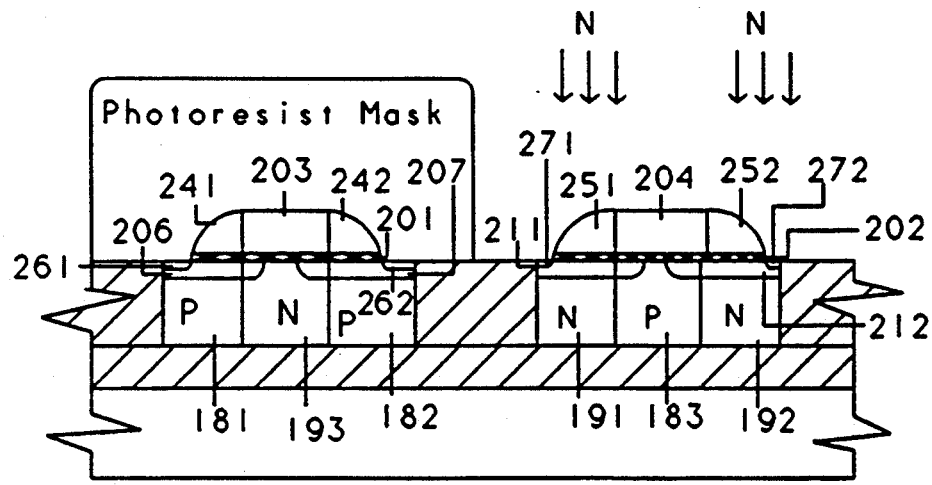

After the formation of the sidewall spacer structure of FIG. 27, very shallow, high impurity concentration (P+) ohmic contact regions 261, 262 are implanted into surface portions of the lightly doped shallow source and drain regions 206 and 207, while N-channel mesa 52 is masked, as shown in FIG. 28. Then, with P-channel mesa 51 masked, very shallow, high impurity concentration (N+) ohmic contact regions 271, 272 are implanted into surface portions of the lightly doped shallow source and drain regions 211 and 212, as shown in FIG. 29.

Figure 30:
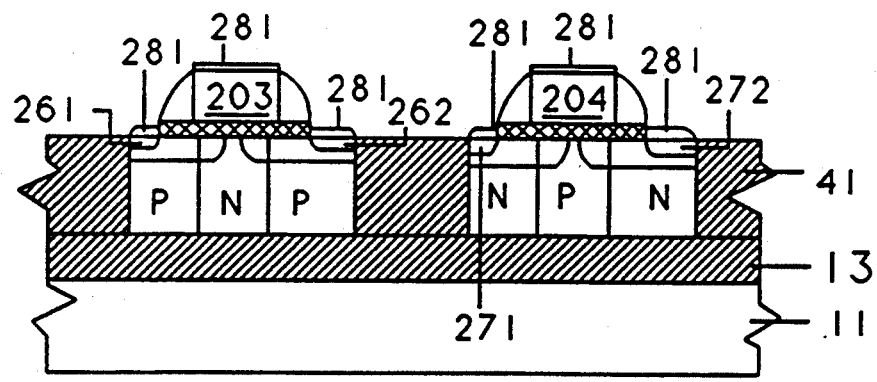

After removal of a thin 'reoxidation' oxide layer from atop the poly layer and the source and drain regions, ohmic contact (e.g. silicide) material 281 is formed on the doped gate layers 203, 204 and upon the high impurity concentration ohmic contact regions 261, 262, 271, 272, thereby completing the basic structure of the MOS SOI device, as shown in FIG. 30.

Figure 31:
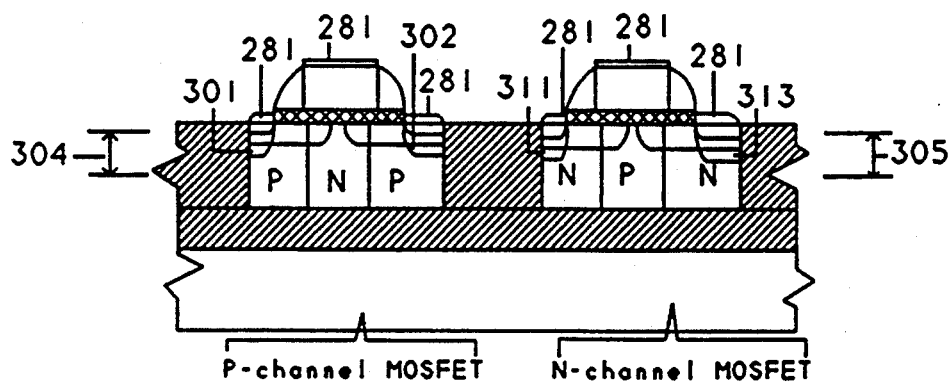

As a further enhancement, as shown in FIG. 31, third and fourth P-type source and drain sub-regions 301, 302 may be implanted in P-channel mesa 51 using its insulated gate structure and sidewall spacers as a mask, to a second depth 304 (on the order of 0.2–0.3 microns) that is deeper than the first depth 208, but still only partially penetrates the thickness of mesa 51. Similarly, third and fourth N-type source and drain sub-regions 311, 313 may be implanted in N-channel mesa 52 using its insulated gate structure and sidewall spacers as a mask, to a second depth 305 (on the order of 0.2–0.3 microns) that is also deeper than the first depth 209, but still only partially penetrates the thickness of mesa 52. These sets of third and fourth sub-regions may have a doping concentration on the order of that of the very lightly doped well implants and serve to effectively 'push-down' the location where a depletion region is formed at the drain/well PN junction, so as to increase the separation between the depletion region and the drain contact region, thereby reducing the possibility of leaky or shorted junctions.

As pointed out above, since the very light doping of the physically deep source and drain regions is within an order of magnitude of the doping concentration of the channel/well mesa (and may be approximately equal to that of the doping concentration of the channel/well mesa), it is low enough that it significantly degrades the injection efficiency of the emitter (source region) of the parasitic lateral bipolar device, and thereby reduces parasitic lateral bipolar gain and increases the sustaining voltage threshold to a value sufficiently greater than the maximum power supply voltage (e.g. $V_{DD}=5$ Volts), that snap-back problems are avoided.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed is:

1. An MOS SOI field effect transistor comprising:
   a semiconductor-on-insulator structure having a semiconductor layer, said semiconductor layer including a channel portion of a first conductivity type, disposed upon an underlying insulator layer;
   source and drain regions of a second conductivity type formed in first and second portions of said semiconductor layer spaced apart from one another by said channel portion thereof, such that said source and drain regions extend from first and second spaced apart surface portions of said semiconductor layer down to said underlying insulator layer, and such that said source and drain regions have a doping concentration that is effective to reduce gain and injection efficiency of an emitter of a parasitic lateral bipolar transistor formed of said source and drain regions and said channel portion and thereby increase a sustaining voltage threshold to a value greater than a maximum power supply voltage, so as to avoid a problem of snap-back, said doping concentration being within an order of magnitude of the doping concentration of said channel portion of said semiconductor layer;
   an insulated gate structure atop said channel portion of said semiconductor layer between said first and second spaced apart surface portions of said semiconductor layer, said insulated gate structure comprising a gate insulator layer and an overlying conductive gate layer;
   first and second sub-regions of said second conductivity type formed in said source and drain regions down to a first depth thereof that only partially penetrates the depth of said source and drain regions, said first and second sub-regions having a doping concentration on the same order of magnitude as that of said source and drain regions and extending partially beneath said insulated gate structure so as to define a channel width of said field effect transistor;
   high impurity concentration ohmic contact regions disposed in surface portions of said first and second sub-regions; and
   ohmic contacts respectively contiguous with said conductive gate layer and said high impurity concentration ohmic contact regions.

2. An MOS SOI field effect transistor according to claim 1, further including third and fourth sub-regions of said second conductivity type formed in said source and drain regions to a second depth that is deeper than said first depth, but only partially penetrating the depth of said source and drain regions to a depth less than a thickness of said semiconductor layer, said third and fourth sub-regions having a doping concentration on the same order of magnitude as that of said source and drain regions.

3. An MOS SOI field effect transistor according to claim 1, wherein the doping concentration of said source and drain regions is approximately equal to that of the doping concentration of the channel portion of said semiconductor layer.

4. An MOS SOI field effect transistor according to claim 1, wherein said underlying insulator layer comprises an oxide layer.

5. An MOS SOI field effect transistor according to claim 1, wherein said first conductivity type is N-type and said second conductivity type is P-type.

6. An MOS SOI field effect transistor according to claim 5, wherein said underlying insulator layer comprises an oxide layer.

7. A CMOS SOI field effect transistor structure comprising:
   a semiconductor-on-insulator structure having a first semiconductor layer and a second semiconductor layer;
   a first field effect transistor having source and drain regions of a first conductivity type formed in first and second portions of said first semiconductor layer spaced apart from one another by a first well region of a second conductivity type, a second well region of said first conductivity type formed in said second semiconductor layer spaced apart from said first and second portions of said first semiconductor layer, said source and drain regions of said first conductivity type and said second well region extend down to an underlying insulator layer, and a second field effect transistor having source and drain regions of a second conductivity type formed in respective first and second portions of said second semiconductor layer spaced apart from one another by said second well region, said source and drain regions of said second conductivity type and said first well region extend down to said underlying insulator layer, and wherein the source and drain regions of said first conductivity type have a doping concentration that is within an order of magnitude of the doping concentration of said first well region of said first semiconductor layer, and wherein the source and drain regions of said second conductivity type have a doping concentration that is effective to reduce gain and injection efficiency of an emitter of a parasitic lateral bipolar transistor formed of the source and drain regions of said second conductivity type and said second well region and thereby increase a sustaining voltage threshold to a value greater than a maximum power supply voltage, so as to avoid a problem of snap-back, said doping concentration of the source and drain regions of the second conductivity type being within an order of magnitude of the doping concentration of said second well region;

a first insulated gate structure formed atop said first well region and a second insulated gate structure atop said second well region, each insulated gate structure comprising a gate insulator layer and an overlying conductive gate layer;

first and second sub-regions of said second conductivity type formed in the source and drain regions of said second conductivity type down to a first depth thereof that only partially penetrates the depth of said source and drain regions of said second conductivity type, said first and second sub-regions of said second conductivity type having a doping concentration on the same order of magnitude as that of the source and drain regions of said second conductivity type and extending partially beneath said second insulated gate structure so as to define a channel width of said second field effect transistor, and first and second sub-regions of said first conductivity type formed in the source and drain regions of said first conductivity type down to a first depth thereof that only partially penetrates the depth of said source and drain regions of said first conductivity type, said first and second sub-regions of said first conductivity type having a doping concentration on the same order of magnitude as that of the source and drain regions of said first conductivity type and extending partially beneath said first insulated gate structure so as to define a channel width of said first field effect transistor;

respective high impurity concentration ohmic contact regions formed in surface portions of the first and second sub-regions of said first and second conductivity types; and ohmic contacts provided on the conductive gate layers and the high impurity concentration ohmic contact regions.

8. A CMOS SOI field effect transistor according to claim 7, further including third and fourth sub-regions of said second conductivity type formed in the source and drain regions of said second conductivity type to a second depth that is deeper than the first depth of said first and second sub-regions of said second conductivity type, but only partially penetrates the depth of the source and drain regions of said second conductivity type to a depth less than the thickness of said second semiconductor layer, said third and fourth sub-regions of said second conductivity type having a doping concentration on the same order of magnitude as that of the source and drain regions of said second conductivity type, and third and fourth sub-regions of said first conductivity type formed in the source and drain regions of said first conductivity type to a second depth that is deeper than the first depth of said first and second sub-regions of said first conductivity type, but only partially penetrates the depth of the source and drain regions of said first conductivity type to a depth less than the thickness of said first semiconductor layer, said third and fourth sub-regions of said first conductivity type having a doping concentration on the same order of magnitude as that of the source and drain regions of said first conductivity type.

9. A CMOS SOI field effect transistor structure according to claim 8, wherein the doping concentration of the source and drain regions of said second conductivity type is approximately equal to that of the doping concentration of said second well region, and wherein the doping concentration of the source and drain regions of said first conductivity type is approximately equal to that of the doping concentration of said first well region.

10. A CMOS SOI field effect transistor structure according to claim 7, wherein said underlying insulator layer comprises an oxide layer.

11. A CMOS SOI field effect transistor structure according to claim 7, wherein said first conductivity type is P-type and said second conductivity type is N-type.

12. A CMOS SOI field effect transistor structure according to claim 11, wherein said underlying insulator layer comprises an oxide layer.

* * * * *